US012677689B2

(12) United States Patent
Kurihara et al.

(10) Patent No.: US 12,677,689 B2
(45) Date of Patent: Jul. 7, 2026

(54) AI WIRING MATERIAL

(71) Applicants: NIPPON MICROMETAL CORPORATION, Saitama (JP); NIPPON STEEL Chemical & Material Co., Ltd., Tokyo (JP)

(72) Inventors: Yuto Kurihara, Saitama (JP); Daizo Oda, Saitama (JP); Motoki Eto, Saitama (JP); Ryo Oishi, Saitama (JP); Tetsuya Oyamada, Tokyo (JP); Tomohiro Uno, Tokyo (JP)

(73) Assignees: Nippon Micrometal Corporation, Saitama (JP); NIPPON STEEL Chemical & Material Co., Ltd., Tokyo (JP)

( * ) Notice: Subject to any disclaimer, the term of this patent is extended or adjusted under 35 U.S.C. 154(b) by 355 days.

(21) Appl. No.: 18/275,584

(22) PCT Filed: Jan. 31, 2022

(86) PCT No.: PCT/JP2022/003580
§ 371 (c)(1),
(2) Date: Aug. 2, 2023

(87) PCT Pub. No.: WO2022/168788
PCT Pub. Date: Aug. 11, 2022

(65) Prior Publication Data
US 2024/0105668 A1     Mar. 28, 2024

(30) Foreign Application Priority Data
Feb. 5, 2021     (JP) ................................. 2021-017609

(51) Int. Cl.
*H10W 72/50*          (2026.01)

(52) U.S. Cl.
CPC .......... *H10W 72/50* (2026.01); *H10W 72/521* (2026.01); *H10W 72/522* (2026.01);
(Continued)

(58) Field of Classification Search
None
See application file for complete search history.

(56) References Cited

U.S. PATENT DOCUMENTS 4,859,811 A  *  8/1989  Sawada .................. C23C 30/00
                                                            72/47
10,730,266 B2    8/2020  Kamat et al.
(Continued)

FOREIGN PATENT DOCUMENTS

CN         104428100 A      3/2015
CN         111951998 A      11/2020
(Continued)

OTHER PUBLICATIONS

Extended European Search Report dated May 16, 2025, issued in corresponding European patent application No. 22749660.1, 13 pages.
(Continued)

*Primary Examiner* — Nishath Yasmeen
(74) *Attorney, Agent, or Firm* — RIMON P.C.

(57)          ABSTRACT

There is provided a novel Al wiring material that achieves both of a suppression of chip damage and a thermal shock resistance. In aspect 1, the Al wiring material includes an Al core material and an Al coating layer formed on a surface of the Al core material, and satisfies $1.2 \leq H_{1h}/H_{1s}$ where $H_{1h}$ is a Vickers hardness of the Al core material (Hv) and $H_{1s}$ is a Vickers hardness of the Al coating layer (Hv). In aspect 2, the Al wiring material includes an Al core material and an Al coating layer formed on a surface of the Al core material, and satisfies $1.2 \leq H_{2h}/H_{2s}$ where $H_{2h}$ is a Vickers hardness of
(Continued)

the Al core material (Hv) and $H_{2h}$ is a Vickers hardness of the Al coating layer (Hv).

20 Claims, 4 Drawing Sheets

(52) U.S. Cl.
CPC ...... *H10W 72/552* (2026.01); *H10W 72/5524* (2026.01); *H10W 72/5525* (2026.01); *H10W 72/555* (2026.01)

(56) References Cited

U.S. PATENT DOCUMENTS

| | | | | |
|---|---|---|---|---|
| 2009/0166067 A1 * | 7/2009 | Iwai | ......................... | H05K 1/05 |
| | | | | 174/257 |
| 2015/0298263 A1 | 10/2015 | Goncharov et al. | | |
| 2015/0303165 A1 | 10/2015 | Milke et al. | | |
| 2018/0304584 A1 | 10/2018 | Kamat et al. | | |
| 2020/0017938 A1 | 1/2020 | Kaneko | | |
| 2020/0307160 A1 | 10/2020 | Kamat et al. | | |

FOREIGN PATENT DOCUMENTS

| | | | | |
|---|---|---|---|---|
| JP | 61-18163 | A | | 1/1986 |
| JP | S6118163 | A | * | 1/1986 |
| JP | H07-66236 | A | | 3/1995 |
| JP | 2002-314038 | A | | 10/2002 |
| JP | 2006-328530 | A | | 12/2006 |
| JP | 2014-224283 | A | | 12/2014 |
| JP | 2016-511529 | A | | 4/2016 |
| JP | 2016-108617 | A | | 6/2016 |
| JP | 2016-152316 | A | | 8/2016 |
| JP | 2020-517828 | A | | 6/2020 |
| WO | 2013/030968 | A1 | | 3/2013 |

OTHER PUBLICATIONS

Office Action received in corresponding Taiwanese Patent Application No. 111104291, dated Oct. 13, 2025.

Partial Supplementary European Search Report issued on Feb. 6, 2025 for the corresponding European Patent Application No. 22749660. 1.

International Search Report issued in corresponding International Patent Application No. PCT/JP2022/003580, dated Mar. 29, 2022, with English translation.

Office Action received in corresponding Singapore Patent Application No. 11202305834X, dated Nov. 14, 2025.

* cited by examiner

AI WIRING MATERIAL

CROSS REFERENCE TO RELATED APPLICATIONS

This application is the U.S. National Phase under 35 U.S.C. § 371 of International Application No. PCT/JP2022/003580, filed on Jan. 31, 2022, which claims the benefit of Japanese Patent Application No. 2021-017609, filed on Feb. 5, 2021, the entire contents of each are hereby incorporated by reference herein.

TECHNICAL FIELD

The present invention relates to an Al wiring material. The present invention further relates to a semiconductor device including the Al wiring material.

BACKGROUND ART

In a semiconductor device, electrodes formed on a semiconductor chip are connected with a lead frame or electrodes on a substrate via a bonding wire or a bonding ribbon (also collectively referred to as "wiring materials"). In a power semiconductor device, a wiring material mainly made of aluminum (Al) (hereinafter, also simply referred to as an "Al wiring material") is used. For example, Patent Literature 1 discloses an example of using an Al bonding wire with a diameter of 300 μm in a power semiconductor module. In the power semiconductor device using the Al wiring material, wedge bonding is used as a bonding process for both of first connection with electrodes on a semiconductor chip and second connection with the lead frame or electrodes on a substrate.

Power semiconductor devices using Al wiring materials are often used as high-power electronic devices such as air conditioners and photovoltaic power generation systems, and on-vehicle semiconductor devices. In these semiconductor devices, a connection part between the wiring material and a member to be connected is exposed to a high temperature of 120° C. or more during operation of the devices. Further, when the semiconductor devices operate by switching high voltage on and off at high speed, it is exposed to a severe environment where the temperature is repetitively increased and decreased. When using a material composed only of high purity Al as the wiring material, softening of the wiring material tends to proceed in such a temperature environment at the time when the device operates, and it is difficult to use such wiring material in a high-temperature environment.

There has been developed an Al wiring material made of a material obtained by adding a specific element to Al. For example, Patent Literature 2 discloses an Al bonding wire the mechanical strength of which is improved by adding scandium (Sc) of 0.05 to 1% by weight to Al to be precipitation-hardened. Patent Literature 3 discloses that an Al wiring material containing one or more of nickel (Ni), silicon (Si), and phosphorus (P), the amount of which is 800 weight ppm or less in total, has a favorable bonding strength and weather resistance.

RELATED ART REFERENCE

Patent Literature

Patent Literature 1: JP-A-2002-314038
Patent Literature 2: JP-A-2016-511529
Patent Literature 3: JP-A-2016-152316

SUMMARY OF INVENTION

Problem to be Solved by the Invention

In a power semiconductor device in which a significant temperature change is caused in accordance with an operation cycle of the device, an impulsive thermal stress may be caused in accordance with the temperature change (hereinafter, such a phenomenon is also referred to as "thermal shock"), and a connection part and the like between an Al wiring material and a member to be connected may be damaged. Specifically, along with the temperature change in accordance with the operation cycle of the device, a crack may be caused at an interface of the connection part due to a difference between coefficients of thermal expansion of the Al wiring material and the member to be connected (hereinafter, such a phenomenon is also referred to as "bond crack"). Additionally, in the power semiconductor device, due to a bending stress caused by expansion and contraction of the Al wiring material itself, a crack may be caused at a loop rising part in the vicinity of the connection part (hereinafter, such a phenomenon is also referred to as "heel crack"). The bond crack or the heel crack develops due to a thermal shock that is repeatedly caused at the time when the device operates, and bonding reliability is deteriorated in some cases such that the Al wiring material finally peels off from the member to be connected.

The bond crack described above can be restrained to be caused by suppressing softening of the Al wiring material under a high-temperature environment and maintaining a strength thereof. For example, regarding the Al wiring material to which Sc or the like is added, the strength can be maintained under a high-temperature environment, and the bond crack can be suppressed under an environment at the time when the device operates. On the other hand, due to the high strength, the heel crack easily develops under the environment at the time when the device operates.

The heel crack can be restrained to be caused by using a soft Al wiring material. For example, the Al wiring material of high-purity or the Al wiring material to which low concentration of Ni is added is relatively soft, and the heel crack can be suppressed. On the other hand, softening easily proceeds under the high-temperature environment, and the bond crack easily develops under the environment at the time when the device operates.

As described above, the heel crack easily develops due to the thermal shock that is repeatedly caused at the time when the device operates as for the conventional Al wiring material having a high strength under a high-temperature environment, and the bond crack easily develops due to the thermal shock that is repeatedly caused at the time when the device operates as for the conventional soft Al wiring material. For both Al wiring materials, there is room for improvement in resistance against the thermal shock (hereinafter, also simply referred to as "thermal shock resistance") in accordance with the operation cycle of the device. Regarding the former Al wiring material having a high strength, it may damage the member to be connected at the time of connection to the member to be connected unless the strength thereof is sufficiently adjusted by heat treatment and the like (hereinafter, such a phenomenon is also referred to as "chip damage").

An object of the present invention is to provide a novel Al wiring material that exhibits favorable thermal shock resistance and may further suppress the chip damage.

Means for Solving Problem

As a result of earnest investigation as to the problems described above, the present inventors have found that the problems described above can be solved by the Al wiring material having the configuration described below, and further investigated the problems based on such knowledge to complete the present invention.

Specifically, the present invention includes the following.

[1] An Al wiring material comprising an Al core material and an Al coating layer formed on a surface of the Al core material, wherein the Al wiring material satisfies $1.2 \leq H_{1h}/H_{1s}$ where $H_{1s}$ is a Vickers hardness of the Al core material (Hv) and $H_{1h}$ is a Vickers hardness of the Al coating layer (Hv).

[2] The Al wiring material according to [1], satisfying $$0.5D \leq d_{1sc} \leq 0.95D$$

where D is a diameter of the Al wiring material (μm) and $d_{1sc}$ is a diameter of the Al core material (μm).

[3] The Al wiring material according to [1] or [2], satisfying a relation of $95 \leq x2 < x1$ where x1 is an Al content in the Al core material (mass %) and x2 is an Al content in the Al coating layer (mass %).

[4] An Al wiring material comprising an Al core material and an Al coating layer formed on a surface of the Al core material, wherein the Al wiring material satisfies $1.2 \leq H_{2h}/H_{2s}$ where $H_{2h}$ is a Vickers hardness of the Al core material (Hv) and $H_{2s}$ is a Vickers hardness of the Al coating layer (Hv).

[5] The Al wiring material according to [4], satisfying $$0.25D \leq d_{2hc} \leq 0.7D$$

where D is a diameter of the Al wiring material (μm) and $d_{2hc}$ is a diameter of the Al core material.

[6] The Al wiring material according to [4] or [5], satisfying a relation of $95 \leq y1 < y2$ where y1 is an Al content in the Al core material (mass %) and y2 is an Al content in the Al coating layer (mass %).

[7] An Al wiring material comprising an Al core material and an Al coating layer formed on a surface of the Al core material, wherein the Al coating layer contains 0.2 to 3 mass %, in total, of one or more element selected from the group consisting of Mg, Sc, Y, Ti, Zr, Hf, V, Nb, Cr, Mo, Mn, Fe, Co, Ni, Cu, Ag, Zn and Si (hereinafter, referred to as a "first group element"), and the Al core material contains 0 to 500 mass ppm, in total, of a metallic element of the group 10 of the periodic table of elements.

[8] The Al wiring material according to [7], satisfying $$0.5D \leq d \leq 0.95D$$

where D is a diameter of the Al wiring material (μm) and d is a diameter of the Al core material (μm).

[9] An Al wiring material comprising an Al core material and an Al coating layer formed on a surface of the Al core material, wherein the Al core material contains 0.2 to 3 mass %, in total, of one or more element selected from the group consisting of Mg, Sc, Y, Ti, Zr, Hf, V, Nb, Cr, Mo, Mn, Fe, Co, Ni, Cu, Ag, Zn and Si (hereinafter, referred to as a "first group element"), and the Al coating layer contains 0 to 500 mass ppm, in total, of a metallic element of the group 10 of the periodic table of elements.

[10] The Al wiring material according to [9], satisfying $$0.25D \leq d \leq 0.7D$$

where D is a diameter of the Al wiring material (μm) and d is a diameter of the Al core material (μm).

[11] The Al wiring material according to any one of [7] to [10], wherein the first group element is selected from the group consisting of Sc, Zr, Fe, Ni, Cu and Si.

[12] The Al wiring material according to any one of [1] to [11], wherein a diameter of the Al wiring material is 100 to 600 μm.

[13] The Al wiring material according to any one of [1] to [12], wherein the Al wiring material is a bonding wire.

[14] A semiconductor device comprising the Al wiring material according to any one of [1] to [13].

Effect of the Invention

The present invention can provide a novel Al wiring material that exhibits favorable thermal shock resistance and may further suppress chip damage.

EMBODIMENT FOR CARRYING OUT THE INVENTION

Figure 1:
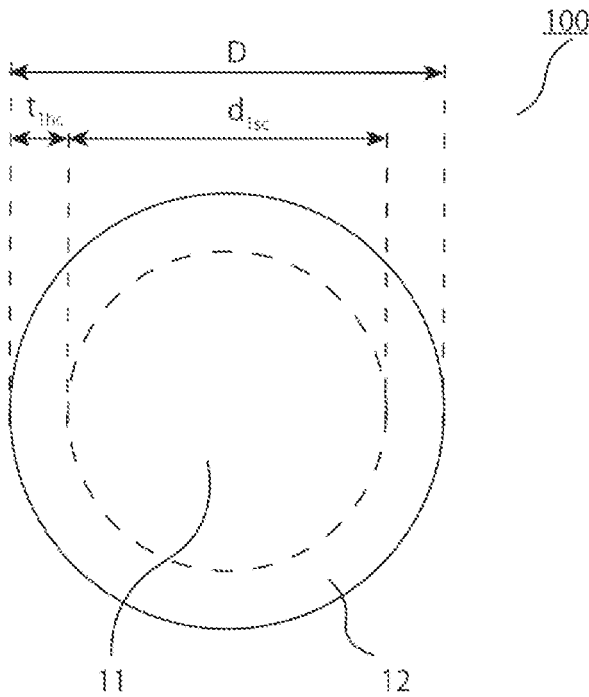
FIG. 1 is a schematic cross-sectional view of an Al wiring material according to an embodiment of the present invention.

Hereinafter, the present invention will be described in detail with reference to preferable embodiments thereof. The drawings may be referred to in the description, but shapes, sizes, and arrangement of constituent elements are merely schematically represented in the drawings to the extent that the invention can be understood. The present invention is not limited by the following description, and each of the constituent elements can be appropriately modified without departing from the gist of the present invention.

[Al Wiring Material]

An Al wiring material according to the present invention includes a hard part and a soft part.

In the Al wiring material according to the present invention, a bond crack can be restrained to develop under an environment at the time when the device operates based on the hard part thereof, and a chip damage can be suppressed at the time of connection to a member to be connected and development of a heel crack can be suppressed under the environment at the time when the device operates based on the soft part thereof. Due to this, the Al wiring material according to the present invention exhibits favorable thermal shock resistance, and can further suppress the chip damage. Furthermore, the Al wiring material according to the present invention exhibits an advantageous effect of being excellent in stability at the time of forming a loop and maintenance of a loop shape based on the hard part thereof.

In the Al wiring material according to the present invention, both of the hard part and the soft part preferably continuously extend in a length direction of the Al wiring material. If the hard part and the soft part continuously extend in the length direction of the Al wiring material, a desired effect can be stably achieved at the time when connection to the member to be connected is made by using the Al wiring material.

In the Al wiring material according to the present invention, both of the hard part and the soft part contain Al as a main component. Herein, the phrase of "contain Al as a principal component" regarding the hard part and the soft part means that each of an Al content in the hard part and an Al content in the soft part is equal to or larger than 50 mass %.

The Al content in the hard part is preferably equal to or larger than 95 mass %, more preferably equal to or larger than 96 mass %, and further preferably equal to or larger than 96.5 mass %. An upper limit of the Al content in the hard part is preferably equal to or smaller than 99.9 mass %, and more preferably equal to or smaller than 99.8 mass %.

The Al content in the soft part is preferably equal to or larger than 95 mass %, more preferably equal to or larger than 96 mass %, further preferably equal to or larger than 97 mass %, equal to or larger than 98 mass %, equal to or larger than 99 mass %, equal to or larger than 99.5 mass %, equal to or larger than 99.6 mass %, or equal to or larger than 99.8 mass %. An upper limit of the Al content in the soft part is not particularly limited, and may be equal to or smaller than 99.9999 mass %, for example.

Particularly, from the viewpoint of further obtaining the effect of the present invention, the Al wiring material of the present invention preferably satisfies a relation of $95 \leq C_{A1h} < C_{A1s}$ where $C_{A1h}$ is the Al content in the hard part (mass %) and $C_{A1s}$ is the Al content in the soft part (mass %). $C_{A1h}$ and $C_{A1s}$ more preferably satisfy a relation of $96 \leq C_{A1h} < C_{A1s}$, and further preferably satisfy a relation of $96.5 \leq C_{A1h} < C_{A1s}$. Particularly, $C_{A1s}$ preferably satisfies a condition of $99.5 \leq C_{A1s}$, more preferably satisfies a condition of $99.6 \leq C_{A1s}$, and further preferably satisfies a condition of $99.8 \leq C_{A1s}$. The upper limit of $C_{A1s}$ may be 99.9999 (mass %) as described above.

In the Al wiring material according to the present invention, Vickers hardness $H_h$ (Hv) of the hard part and Vickers hardness $H_s$ (Hv) of the soft part preferably satisfy a relation of $1.2 \leq H_h/H_s$. A value of $H_h/H_s$ is more preferably equal to or larger than 1.3, further preferably equal to or larger than 1.4, equal to or larger than 1.5, equal to or larger than 1.6, equal to or larger than 1.8, or equal to or larger than 2.0. An upper limit of the value of $H_h/H_s$ is not particularly limited, but may be equal to or smaller than 8.0, equal to or smaller than 6.0, or equal to or smaller than 5.0, for example.

The Vickers hardness $H_h$ of the hard part is not particularly limited so long as it satisfies the relation of $H_h/H_s$ described above together with the Vickers hardness $H_s$ of the soft part, but may be preferably equal to or larger than 20 Hv, and more preferably equal to or larger than 22 Hv, equal to or larger than 24 Hv, or equal to or larger than 25 Hv from the viewpoint of further suppressing development of a bond crack under the environment at the time when the device operates. An upper limit of $H_h$ is not particularly limited, but may be equal to or smaller than 100 Hv, equal to or smaller than 95 Hv, or equal to or smaller than 90 Hv, for example.

The Al wiring material according to the present invention may be an Al bonding wire, or may be an Al bonding ribbon. In a case where the Al wiring material of the present invention is the Al bonding wire, the diameter of the Al bonding wire is not particularly limited and may be 100 to 600 μm, for example. In a case where the Al wiring material of the present invention is the Al bonding ribbon, the dimensions (W×T) of a rectangular or substantially rectangular cross section thereof are not particularly limited, and W may be 100 to 3000 μm, and T may be 50 to 600 μm, for example. In the following description about the dimensions of the hard part and the soft part, preferred ranges of each of the dimensions D, $d_{1sc}$, $t_{1hc}$, $d_{2hc}$, $t_{2sc}$, d, and t will be described in association with the Al bonding wire, but in a case where the Al wiring material is the Al bonding ribbon, the dimensions may be applied assuming that the dimension T of the rectangular or substantially rectangular cross section corresponds to D.

In the Al wiring material of the present invention, arrangement of the hard part and the soft part are not particularly limited so long as they are arranged so that one of them covers the other one. For example, the Al wiring material of the present invention may include an Al core material as the soft part and an Al coating layer as the hard part. Hereinafter, such an embodiment is referred to as an "aspect 1". The Al wiring material of the present invention may also include an Al core material as the hard part and an Al coating layer as the soft part. Hereinafter, such an embodiment is referred to as an "aspect 2".

Aspect 1

The Al wiring material according to the aspect 1 includes the Al core material as the soft part and the Al coating layer as the hard part formed on a surface of the Al core material.

The Al wiring material according to the aspect 1 includes the hard Al coating layer on the surface thereof, so that generation of a bond crack can be reduced under the environment at the time when the device operates. The Al wiring material according to the aspect 1 also includes the soft Al core material, so that a chip damage can be suppressed at the time of connection to the member to be connected. Additionally, softness of a loop rising part in the vicinity of the connection part can be secured based on the soft Al core material, so that development of a heel crack can also be reduced under the environment at the time when the device operates.

In the Al wiring material according to the aspect 1, the hard part and the soft part are the same as described above. From the viewpoint that both of suppression of a chip damage and thermal shock resistance can be achieved at a high level, it is preferable to satisfy $1.2 \leq H_{1h}/H_{1s}$ where $H_{1s}$ is the Vickers hardness of the Al core material (Hv) and $H_{1h}$ is the Vickers hardness of the Al coating layer (Hv). A more preferred range of $H_{1h}/H_{1s}$ is the same as described above regarding $H_h/H_s$.

From the viewpoint of suppressing a chip damage and achieving favorable thermal shock resistance by suppressing development of a heel crack, the diameter $d_{1sc}$ (μm) of the Al core material is preferably equal to or larger than 0.5D, more preferably equal to or larger than 0.52D, and even more preferably equal to or larger than 0.54D, equal to or larger than 0.56D, equal to or larger than 0.58D, or equal to or larger than 0.6D, when defining the diameter of the Al wiring material as D (μm). From the viewpoint of suppressing generation of a bond crack and achieving favorable thermal shock resistance, an upper limit of the diameter $d_{1sc}$ (μm) is preferably equal to or smaller than 0.95D, more preferably equal to or smaller than 0.93D, even more preferably equal to or smaller than 0.92D, equal to or smaller than 0.9D, equal to or smaller than 0.88D, equal to or smaller than 0.86D, or equal to or smaller than 0.85D. Particularly, it is preferable that the diameter $d_{1sc}$ (μm) of the Al core material be equal to or larger than 0.52D and equal to or smaller than 0.93D because there can be achieved the Al wiring material that can suppress a chip damage and is excellent in thermal shock resistance.

Thus, in a preferred embodiment, the diameter $d_{1sc}$ (μm) of the Al core material satisfies a relation of $0.5D \le d_{1sc} \le 0.95D$, and more preferably satisfies a relation of $0.52D \le d_{1sc} \le 0.93D$, when defining the diameter of the Al wiring material as D (μm).

From the viewpoint of suppressing generation of a bond crack and achieving favorable thermal shock resistance, the thickness $t_{1hc}$ (μm) of the Al coating layer is preferably equal to or larger than 0.02D, more preferably equal to or larger than 0.03D, and even more preferably equal to or larger than 0.04D, equal to or larger than 0.05D, equal to or larger than 0.06D, equal to or larger than 0.08, or equal to or larger than 0.1D, when defining the diameter of the Al wiring material as D (μm). From the viewpoint of suppressing a chip damage and achieving favorable thermal shock resistance by suppressing development of a heel crack, an upper limit of the thickness $t_{1hc}$ (μm) is preferably equal to or smaller than 0.25D, more preferably equal to or smaller than 0.24D, and even more preferably equal to or smaller than 0.23D, equal to or smaller than 0.22D, or equal to or smaller than 0.2D. Particularly, it is preferable that the thickness $t_{1hc}$ (μm) of the Al coating layer be equal to or larger than 0.03D and equal to or smaller than 0.24D because there can be achieved the Al wiring material that may suppress a chip damage and is excellent in thermal shock resistance.

Thus, in a preferred embodiment, assuming that the wire diameter of the Al wiring material is D (μm), the thickness $t_{1hc}$ (μm) of the Al coating layer satisfies a relation of $0.02D \le t_{1hc} \le 0.25D$, and more preferably satisfies a relation of $0.03D \le t_{1hc} \le 0.24D$.

In the Al wiring material according to the aspect 1, the preferred ranges of the Al content in the soft part (Al core material) and the Al content in the hard part (Al coating layer) are the same as described above. Particularly, from the viewpoint of further achieving effects of the present invention, it is preferable to satisfy a relation of $95 \le x2 \le x1$ where x1 is the Al content in the Al core material (mass %) and x2 is the Al content in the Al coating layer (mass %). x1 and x2 more preferably satisfies a relation of $96 \le x2 < x1$, and even more preferably satisfies a relation of $96.5 \le x2 < x1$. Particularly, x1 preferably satisfies a condition of $99.5 \le x1$, more preferably satisfies a condition of $99.6 \le x1$, and even more preferably satisfies a condition of $99.8 \le x1$. The upper limit of x1 may be 99.9999 (mass %) as described above, for example.

With reference to FIG. 1, the Al wiring material according to the aspect 1 will be further described. FIG. 1 illustrates a schematic cross-sectional view (a schematic diagram of a C cross section) of an example of the Al wiring material according to the aspect 1. An Al wiring material 100 illustrated in FIG. 1 includes an Al core material 11 as a soft part, and an Al coating layer 12 as a hard part formed on a surface of the Al core material 11. The Al core material and the Al coating layer are the same as described above, and the dimensions $d_{1sc}$ and $t_{1hc}$ thereof, the Al content, and the diameter D of the Al wiring material are also the same as described above.

Regarding the Al wiring material according to the aspect 1, when determining the presence of the Al core material and the Al coating layer or the dimensions thereof, the Vickers hardness is measured on the C cross section of the Al wiring material at regular intervals from the surface side of the Al wiring material toward the center thereof. As a method of exposing the C cross section of the Al wiring material, mechanical polishing can be used.

In measuring the Vickers hardness on the C cross section of the Al wiring material, the Vickers hardness is measured at regular intervals on a straight line connecting the surface side to the center. Herein, when the measurement point interval is small in measuring the Vickers hardness, the hardness may be erroneously recognized due to an indentation at an adjacent measurement point. Thus, the measurement point of the Vickers hardness needs to be determined with a reasonable interval that is assumed from a size of the indentation generated at the time of measurement (that is, a sufficient interval for suppressing erroneous recognition of the hardness due to the indentation at the adjacent measurement point). For example, by determining a plurality of straight lines connecting the surface side to the center, and measuring the Vickers hardness at regular intervals on each of the straight lines for the C cross section of the Al wiring material, there can be obtained the information about the Vickers hardness at fine intervals while securing sufficient measurement point intervals.

Specifically, when X straight lines (straight lines $L_1$, $L_2$, $L_3$, . . . $L_X$) connecting the surface side to the center are determined on the C cross section of the Al wiring material, the Vickers hardness may be measured at a point having the following distance from the surface of the Al wiring material for each of the straight lines.

Straight line $L_1$: each point at (Xn+1)a
Straight line $L_2$: each point at (Xn+2)a
Straight line $L_3$: each point at (Xn+3)a
. . .
Straight line $L_X$: each point at (Xn+X)a Herein, "X" represents the number of determined straight lines, "n" represents an integral number equal to or larger than 0, and "a" represents a plot interval (μm) of a Vickers hardness profile that is desired to be acquired. The number X of the straight lines is appropriately determined so that a value of X×a becomes a reasonable interval that is assumed from the size of the indentation generated at the time of measurement (that is, a sufficient interval for suppressing erroneous recognition of the hardness due to the indentation at the adjacent measurement point).

Figure 4:
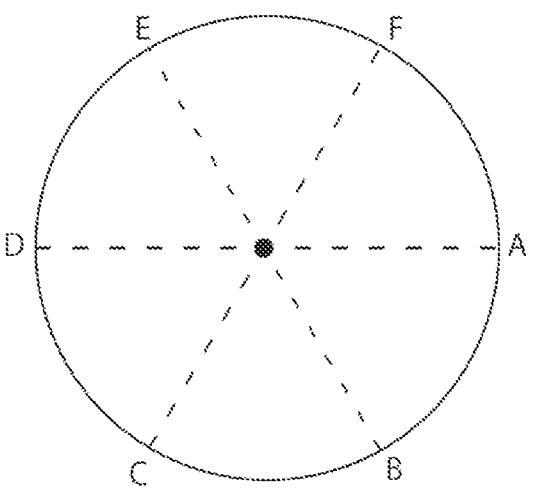
FIG. 4 is a schematic diagram for explaining an example of a method of measuring Vickers hardness of the Al wiring material.

In FIG. 4, six straight lines A, B, C, D, E and F the inclinations of which are different from each other by 60° are determined. For example, the Vickers hardness is measured at each point at a distance of (6n+1)×3 (μm) from the surface such that the distance from the surface of the Al wiring material is 3 μm, 21 μm, 39 μm, 57 μm, . . . on the straight line A, and the Vickers hardness may be measured at each point at a distance of (6n+2)×3 (μm) on the straight line B, at each point at a distance of (6n+3)×3 (μm) on the straight line C, at each point at a distance of (6n+4)×3 (μm) on the straight line D, at each point at a distance of (6n+5) (μm) on the straight line E, and at each point at a distance of (6n+6)×3 (μm) on the straight line F. Profiles of the Vickers hardness obtained for the respective straight lines A, B, C, D, E and F are then integrated to form one hardness profile.

Due to this, it is possible to obtain the information of the Vickers hardness at intervals of 3 μm from the surface side of the Al wiring material toward the center. In determining a plurality of straight lines on the C cross section, it is not necessary to determine the straight lines the inclinations of which are different from each other by the same angle. A plurality of straight lines the inclinations of which are different from each other by different angles may be determined so long as each of the straight lines connects the surface side of the Al wiring material to the center and a pitch between measurement points of the Vickers hardness can be sufficiently secured. The hardness profile is preferably acquired for three or more C cross sections that are separated from each other by 10 mm or more in a longitudinal direction of the Al wiring material.

Figure 5:
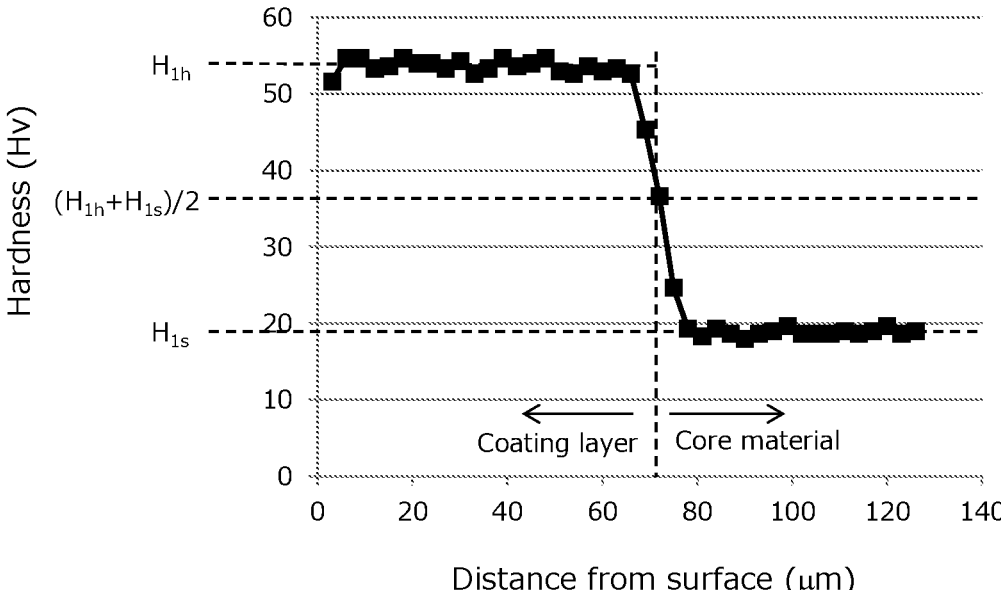
FIG. 5 is a diagram illustrating an example of a Vickers hardness profile of the Al wiring material according to an embodiment of the present invention.

There will be described a trend of the hardness profile obtained for the Al wiring material according to the aspect 1 with reference to FIG. 5. FIG. 5 is an example of the hardness profile of the Al wiring material according to the aspect 1. A flat region (plateau region) in which the Vickers hardness shows substantially a constant value is present from the surface of the Al wiring material to a certain depth position (distance). Further advancing toward the center of the Al wiring material, the Vickers hardness is lowered, and thereafter there is a flat region in which the Vickers hardness shows substantially a constant value.

In the present invention, the "Vickers hardness $H_{1s}$ (Hv) of the Al core material", the "Vickers hardness $H_{1h}$ (Hv) of the Al coating layer", the "thickness $t_{1hc}$ (μm) of the Al coating layer", and the "diameter $d_{1sc}$ (μm) of the Al core material" of the Al wiring material according to the aspect 1 can be obtained by using a method described in "—Determination of hard part and soft part based on Vickers hardness—" in a column of [Measurement of Vickers hardness] described later based on the obtained hardness profile.

The Vickers hardness can be adjusted by adjusting/controlling composition of an Al material constituting the Al wiring material, a processing degree and heat treatment of the Al wiring material at the time of manufacture, and the like.

There will be described a particularly preferable composition of the Al wiring material from the viewpoint of achieving the Al wiring material according to the aspect 1 including the Al core material as the soft part and the Al coating layer as the hard part.

That is, in an embodiment, the Al wiring material includes the Al core material and the Al coating layer formed on the surface of the Al core material, the Al coating layer contains 0.2 to 3 mass %, in total, of one or more element selected from the group consisting of Mg, Sc, Y, Ti, Zr, Hf, V, Nb, Cr, Mo, Mn, Fe, Co, Ni, Cu, Ag, Zn, and Si (hereinafter, also referred to as a "first group element"), and the Al core material contains 0 to 500 mass ppm, in total, of a metallic element of the group 10 of the periodic table of elements (hereinafter, also referred to as a "second group element"). Hereinafter, such an embodiment is also referred to as an "aspect 1'".

"The Al core material contains 0 to 500 mass ppm, in total, of the second group element" encompasses both of a case where the Al core material does not contain the second group element and a case where the Al core material contains the second group element in a range equal to or smaller than 500 mass ppm.

Al or an Al alloy containing 0 to 500 mass ppm of the second group element in total forms the soft part described above, and an Al alloy containing 0.2 to 3 mass % of the first group element in total forms the hard part described above.

Thus, the Al wiring material having the composition described above may achieve the Al wiring material according to the aspect 1 including the Al core material as the soft part and the Al coating layer as the hard part.

In the Al wiring material according to the aspect 1', a preferred range of the diameter d (μm) of the Al core material is the same as the preferred range of the diameter $d_{1sc}$ (μm) of the Al core material of the Al wiring material according to the aspect 1 described above. Thus, in a preferred embodiment, the diameter d (μm) of the Al core material satisfies a relation of 0.5D≤d≤0.95D, and more preferably satisfies a relation of 0.52D≤d≤0.93D, when defining the diameter of the Al wiring material as D (μm).

In the Al wiring material according to the aspect 1', a preferred range of the thickness t (μm) of the Al coating layer is the same as the preferred range of the thickness $t_{1hc}$ (μm) of the Al coating layer of the Al wiring material according to the aspect 1 described above. Thus, in a preferred embodiment, the thickness t (μm) of the Al coating layer satisfies a relation of 0.02D≤t≤0.25D, and more preferably satisfies a relation of 0.03D≤t≤0.24D, when defining the wire diameter of the Al wiring material as D (μm).

In the Al wiring material according to the aspect 1', the preferred ranges of the Al content in the Al core material and the Al content in the Al coating layer are the same as described above for the hard part and the soft part. Particularly, from the viewpoint of further achieving effects of the present invention, it is preferable to satisfy a relation of 95≤x2<x1, where x1 is the Al content in the Al core material (mass %) and x2 is the Al content in the Al coating layer (mass %). Preferred conditions for x1 and x2 are the same as described above regarding the Al wiring material according to the aspect 1.

According to a preferred embodiment, the Al core material contains 0 to 500 mass ppm of the second group element in total, and the balance of the Al core material consists of Al and inevitable impurities. A term of "inevitable impurities" regarding the Al core material encompasses an element constituting the Al coating layer (for example, the first group element).

According to a preferred embodiment, the Al coating layer contains 0.2 to 3 mass % of the first group element in total, and the balance of the Al coating layer consists of Al and inevitable impurities. A term of "inevitable impurities" regarding the Al coating layer encompasses an element constituting the Al core material (for example, the second group element).

From the viewpoint of achieving the Al wiring material that may suppress a chip damage and is excellent in thermal shock resistance, the first group element contained in the Al coating layer is selected from the group consisting of Mg, Sc, Y, Ti, Zr, Hf, V, Nb, Cr, Mo, Mn, Fe, Co, Ni, Cu, Ag, Zn and Si in combination with the Al core material. Particularly, from the viewpoint of further achieving effects of the present invention, the Al coating layer more preferably contains one or more element selected from the group consisting of Sc, Zr, Fe, Ni, Cu and Si as the first group element.

From the viewpoint of suppressing generation of a bond crack and achieving favorable thermal shock resistance, a total concentration ($c_1$) of the first group element in the Al coating layer is preferably equal to or larger than 0.2 mass %, more preferably equal to or larger than 0.4 mass %, and even more preferably equal to or larger than 0.5 mass %, equal to or larger than 0.6 mass %, equal to or larger than 0.8 mass %, or equal to or larger than 1 mass %. From the viewpoint of suppressing a chip damage and achieving favorable thermal shock resistance by suppressing development of a heel crack, an upper limit of the total concentration is preferably equal to or smaller than 3 mass %, and more preferably equal to or smaller than 2.8 mass %, equal to or smaller than 2.6 mass %, or equal to or smaller than 2.5 mass %.

From the viewpoint of suppressing a chip damage and achieving favorable thermal shock resistance by suppressing development of a heel crack, a total concentration ($c_2$) of the second group element in the Al core material is preferably equal to or smaller than 500 mass ppm, and more preferably equal to or smaller than 480 mass ppm, equal to or smaller than 460 mass ppm, equal to or smaller than 450 mass ppm, equal to or smaller than 440 mass ppm, equal to or smaller than 420 mass ppm, or equal to or smaller than 400 mass ppm. A lower limit of the total concentration thereof is not particularly limited, and may be 0 mass ppm. The Al core material containing the second group element is advantageous because the corrosion resistance of the Al wiring material can be improved. In the Al wiring material according to the present invention, the Al core material may contain, as the second group element, one or more of Ni, Pd and Pt, for example, may contain a combination of two elements such as Ni and Pd, Ni and Pt, or Pd and Pt, may contain a combination of three elements including Ni, Pd and Pt, or may contain only one thereof.

Figure 3:
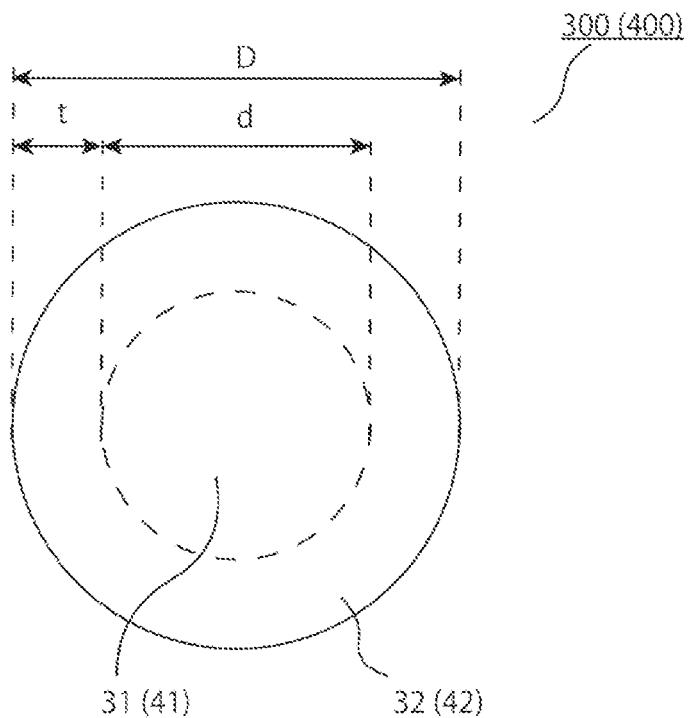
FIG. 3 is a schematic cross-sectional view of the Al wiring material according to an embodiment of the present invention.

With reference to FIG. 3, the Al wiring material according to the aspect 1' will be further described. FIG. 3 illustrates a schematic cross-sectional view (a schematic diagram of the C cross section) of an example of the Al wiring material according to the aspect 1'. An Al wiring material 300 illustrated in FIG. 3 includes an Al core material 31 and an Al coating layer 32. The Al core material and the Al coating layer are the same as described above, and the dimensions d and t thereof, composition such as the Al content, and the diameter D of the Al wiring material are also the same as described above.

Regarding the Al wiring material according to the aspect 1', in determining presence of the Al core material and the Al coating layer or the dimensions thereof, a concentration analysis focusing on the first group element is performed on the C cross section of the Al wiring material from the surface side of the Al wiring material toward the center. As an analysis device used for the concentration analysis, an energy dispersion-type X-ray analysis (EDS), an electro probe microanalyzer (EPMA), a secondary ion mass spectrometry (SIMS), and the like can be used. For example, by performing linear analysis for the straight line A illustrated in FIG. 4, it is possible to obtain a concentration profile of an element to be analyzed (first group element) from the surface of the Al wiring material to the center. It is preferable to acquire concentration profiles for three or more C cross sections separated from each other by 10 mm or more in the longitudinal direction of the Al wiring material.

In the present invention, the "total concentration $c_1$ (mass %) of the first group element in the Al coating layer", the "diameter d (μm) of the Al core material", and the "thickness t (μm) of the Al coating layer" of the Al wiring material according to the aspect 1' can be obtained by using a method described in "—Determination of Al core material and Al coating layer based on total concentration $c_1$ of first group element—" in a column of [Measurement of element content] described later based on the obtained concentration profile. The "total concentration $c_2$ (mass ppm) of the second group element in the Al core material" can be measured by using a method described in "—Measurement of total concentration $c_2$ of second group element—" in the column of [Measurement of element content] described later.

Aspect 2

The Al wiring material according to the aspect 2 includes the Al core material as the hard part, and the Al coating layer as the soft part formed on the surface of the Al core material.

The Al wiring material according to the aspect 2 includes the soft Al coating layer on the surface thereof, so that softness of the loop rising part in the vicinity of the connection part can be secured. Thus, generation of a heel crack can be reduced under the environment at the time when the device operates. Due to the soft Al coating layer, a chip damage can be suppressed at the time of connection to the member to be connected. Additionally, based on the hard Al core material, even when a bond crack is generated under the environment at the time when the device operates, the development of the crack can be reduced at the time when the crack reaches the hard Al core material.

In the Al wiring material according to the aspect 2, the hard part and the soft part are the same as described above. From the viewpoint that both of suppression of a chip damage and thermal shock resistance can be achieved at a high level, it is preferable to satisfy $1.2 \leq H_{2h}/H_{2s}$, where that $H_{2h}$ is the Vickers hardness of the Al core material (Hv) and $H_{2s}$ is the Vickers hardness of the Al coating layer (Hv). A more preferred range of $H_{2h}/H_{2s}$ is the same as described above regarding $H_h/H_s$.

From the viewpoint of suppressing development of a bond crack and achieving favorable thermal shock resistance, the diameter $d_{2hc}$ (μm) of the Al core material is preferably equal to or larger than 0.25D, more preferably equal to or larger than 0.3D, and even more preferably equal to or larger than 0.32D, equal to or larger than 0.34D, or equal to or larger than 0.35D, when defining the diameter of the Al wiring material as D (μm). From the viewpoint of suppressing a chip damage and achieving favorable thermal shock resistance by suppressing generation of a heel crack, an upper limit of the diameter $d_{2hc}$ (μm) is preferably equal to or smaller than 0.7D, more preferably equal to or smaller than 0.65D, and even more preferably equal to or smaller than 0.64D, equal to or smaller than 0.62D, or equal to or smaller than 0.6D. Particularly, it is preferable that the diameter $d_{2hc}$ (μm) of the Al core material be equal to or larger than 0.3D and equal to or smaller than 0.65D because there can be achieved the Al wiring material that may suppress a chip damage and is excellent in thermal shock resistance.

Thus, in a preferred embodiment, the diameter $d_{2hc}$ (μm) of the Al core material satisfies a relation of $0.25D \leq d_{2hc} \leq 0.7D$, and more preferably satisfies a relation of $0.3D \leq d_{2hc} \leq 0.65D$, when defining the diameter of the Al wiring material as D (μm).

From the viewpoint of suppressing a chip damage and achieving favorable thermal shock resistance by suppressing generation of a heel crack, the thickness $t_{2sc}$ (μm) of the Al coating layer is preferably equal to or larger than 0.16D, more preferably equal to or larger than 0.18D, and even more preferably equal to or larger than 0.2D, when defining the diameter of the Al wiring material as D (μm). From the viewpoint of suppressing the development of a bond crack and achieving a favorable thermal shock resistance, an upper limit of the thickness $t_{2sc}$ (μm) is preferably equal to or smaller than 0.37D, more preferably equal to or smaller than 0.35D, and even more preferably equal to or smaller than 0.34D, equal to or smaller than 0.32D, or equal to or smaller than 0.3D. Particularly, it is preferable that the thickness $t_{2sc}$ (μm) of the Al coating layer be equal to or larger than 0.18D and equal to or smaller than 0.35D because there can be achieved the Al wiring material that may suppress a chip damage and is excellent in thermal shock resistance.

Thus, in a preferred embodiment, the thickness $t_{2sc}$ (μm) of the Al coating layer satisfies a relation of $0.16D \leq t_{2sc} \leq 0.37D$, and more preferably satisfies a relation of $0.18D \leq t_{2sc} \leq 0.35D$, when defining the diameter of the Al wiring material as D (μm).

In the Al wiring material according to the aspect 2, the preferred ranges of the Al content in the hard part (Al core material) and the Al content in the soft part (Al coating layer) are the same as described above.

Particularly, from the viewpoint of further achieving effects of the present invention, it is preferable to satisfy a relation of $95 \leq y1 < y2$, where y1 is the Al content in the Al core material (mass %) and y2 is the Al content in the Al coating layer (mass %). y1 and y2 more preferably satisfies a relation of $96 \leq y1 < y2$, and even more preferably satisfies a relation of $96.5 \leq y1 < y2$. Particularly, y2 preferably satisfies a condition of $99.5 \leq y2$, more preferably satisfies a condition of $99.6 \leq y2$, and even more preferably satisfies a condition of $99.8 \leq y2$. The upper limit of y2 may be 99.9999 (mass %) as described above, for example.

Figure 2:
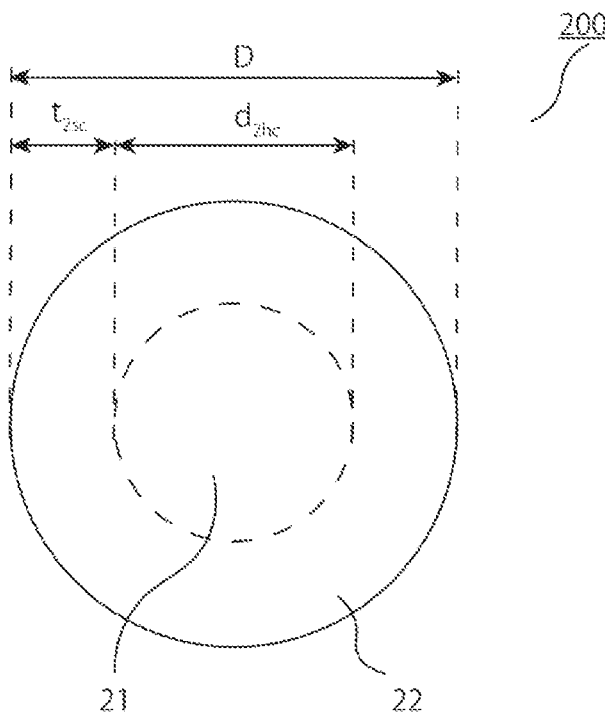
FIG. 2 is a schematic cross-sectional view of the Al wiring material according to an embodiment of the present invention.

With reference to FIG. 2, the Al wiring material according to the aspect 2 will be further described. FIG. 2 illustrates a schematic cross-sectional view (a schematic diagram of a C cross section) of an example of the Al wiring material according to the aspect 2. An Al wiring material 200 illustrated in FIG. 2 includes an Al core material 21 as the hard part, and an Al coating layer 22 as the soft part formed on the surface of the core material 21. The Al core material and the Al coating layer are the same as described above, and the dimensions $d_{2hc}$ and $t_{2sc}$ thereof, the Al content, and the diameter D of the Al wiring material are also the same as described above.

Regarding the Al wiring material according to the aspect 2, in determining presence of the Al core material and the Al coating layer or the dimensions thereof, the Vickers hardness is measured. The Vickers hardness can be measured by using the same method as described above regarding the Al wiring material according to the aspect 1.

In the present invention, the "Vickers hardness $H_{2s}$ (Hv) of the Al coating layer", the "Vickers hardness $H_{2h}$ (Hv) of the Al core material", the "thickness $t_{2sc}$ (μm) of the Al coating layer", and the "diameter $d_{2hc}$ (μm) of the Al core material" of the Al wiring material according to the aspect 2 can be obtained by using a method described in "—Determination of hard part and soft part based on Vickers hardness—" in a column of [Measurement of Vickers hardness] described later based on the obtained hardness profile.

There will be described a particularly preferable composition of the Al wiring material from the viewpoint of achieving the Al wiring material according to the aspect 2 including the Al core material as the hard part and the Al coating layer as the soft part.

That is, according to an embodiment, the Al wiring material includes the Al core material and the Al coating layer formed on the surface of the Al core material, the Al core material contains 0.2 to 3 mass %, in total, of one or more element selected from the group consisting of Mg, Sc, Y, Ti, Zr, Hf, V, Nb, Cr, Mo, Mn, Fe, Co, Ni, Cu, Ag, Zn and Si ("first group element"), and the Al coating layer contains 0 to 500 mass ppm, in total, of a metallic element of the group 10 of the periodic table of elements ("second group element"). Hereinafter, such an embodiment is also referred to as an "aspect 2'".

"The Al coating layer contains 0 to 500 mass ppm, in total, of the second group element" encompasses both of a case where the Al coating layer does not contain the second group element and a case where the Al coating layer contains the second group element in a range equal to or smaller than 500 mass ppm.

An Al alloy containing 0.2 to 3 mass % of the first group element in total forms the hard part described above, and Al or an Al alloy containing 0 to 500 mass ppm of the second group element in total forms the soft part described above. Thus, the Al wiring material having the composition described above may achieve the Al wiring material according to the aspect 2 including the Al core material as the hard part and the Al coating layer as the soft part.

In the Al wiring material according to the aspect 2', a preferred range of the diameter d (μm) of the Al core material is the same as the preferred range of the diameter $d_{2hc}$ (μm) of the Al core material of the Al wiring material according to the aspect 2 described above. Thus, in a preferred embodiment, the diameter d (μm) of the Al core material satisfies a relation of $0.25D \leq d \leq 0.7D$, and more preferably satisfies a relation of $0.3D \leq d \leq 0.65D$, when defining the diameter of the Al wiring material as D (μm).

In the Al wiring material according to the aspect 2', a preferred range of the thickness t (μm) of the Al coating layer is the same as the preferred range of the thickness $t_{2sc}$ (μm) of the Al coating layer of the Al wiring material according to the aspect 2 described above. Thus, in a preferred embodiment, the thickness t (μm) of the Al coating layer satisfies a relation of $0.16D \leq t \leq 0.37D$, and more preferably satisfies a relation of $0.18D \leq t \leq 0.35D$, when defining the diameter of the Al wiring material as D (μm).

In the Al wiring material according to the aspect 2', the preferred ranges of the Al content in the Al core material and the Al content in the Al coating layer are the same as described above for the hard part and the soft part. Particularly, from the viewpoint of further achieving effects of the present invention, it is preferable to satisfy a relation of $95 \leq y1 < y2$, where y1 is the Al content in the Al core material (mass %) and y2 is the Al content in the Al coating layer (mass %). Preferred conditions for y1 and y2 are the same as described above regarding the Al wiring material according to the aspect 2.

According to a preferred embodiment, the Al core material contains 0.2 to 3 mass % of the first group element in total, and the balance of the Al core material consists of Al and inevitable impurities. A term of "inevitable impurities" regarding the Al core material encompasses an element constituting the Al coating layer (for example, the second group element).

According to a preferred embodiment, the Al coating layer contains 0 to 500 mass ppm of the second group element in total, and the balance of the Al coating layer consists of Al and inevitable impurities. A term of "inevitable impurities" regarding the Al coating layer encompasses an element constituting the Al core material (for example, the first group element).

From the viewpoint of achieving the Al wiring material that may significantly suppress a chip damage and is excellent in thermal shock resistance, the first group element contained in the Al core material is selected from the group consisting of Mg, Sc, Y, Ti, Zr, Hf, V, Nb, Cr, Mo, Mn, Fe, Co, Ni, Cu, Ag, Zn and Si in combination with the Al coating layer. Particularly, from the viewpoint of further achieving effects of the present invention, the Al core material more preferably contains one or more element selected from the group consisting of Sc, Zr, Fe, Ni, Cu and Si as the first group element.

From the viewpoint of suppressing development of a bond crack and achieving favorable thermal shock resistance, a total concentration ($c_1$) of the first group element in the Al core material is preferably equal to or larger than 0.2 mass %, more preferably equal to or larger than 0.4 mass %, and even more preferably equal to or larger than 0.5 mass %, equal to or larger than 0.6 mass %, equal to or larger than 0.8 mass %, or equal to or larger than 1 mass %. From the viewpoint of suppressing a chip damage and achieving favorable thermal shock resistance by suppressing generation of a heel crack, an upper limit of the total concentration thereof is preferably equal to or smaller than 3 mass %, and more preferably equal to or smaller than 2.8 mass %, equal to or smaller than 2.6 mass %, or equal to or smaller than 2.5 mass %.

From the viewpoint of suppressing a chip damage and achieving favorable thermal shock resistance by suppressing generation of a heel crack, a total concentration ($c_2$) of the second group element in the Al coating layer is preferably equal to or smaller than 500 mass ppm, and more preferably equal to or smaller than 480 mass ppm, equal to or smaller than 460 mass ppm, equal to or smaller than 450 mass ppm, equal to or smaller than 440 mass ppm, equal to or smaller than 420 mass ppm, or equal to or smaller than 400 mass ppm. A lower limit of the total concentration thereof is not particularly limited, and may be 0 mass ppm. The Al coating layer containing the second group element is advantageous because a corrosion resistance of the Al wiring material can be improved. In the Al wiring material according to the present invention, the Al coating layer may contain, as the second group element, one or more of Ni, Pd and Pt, for example, may contain a combination of two elements such as Ni and Pd, Ni and Pt, or Pd and Pt, may contain a combination of three elements including Ni, Pd and Pt, or may contain only one thereof.

With reference to FIG. 3, the Al wiring material according to the aspect 2' will be further described. FIG. 3 illustrates a schematic cross-sectional view (a schematic diagram of the C cross section) of an example of the Al wiring material according to the aspect 2'. An Al wiring material 400 illustrated in FIG. 3 includes an Al core material 41 and an Al coating layer 42. The Al core material and the Al coating layer are the same as described above, and the dimensions d and t thereof, composition such as the Al content, and the diameter D of the Al wiring material are also the same as described above.

Regarding the Al wiring material according to the aspect 2', in determining presence of the Al core material and the Al coating layer or the dimensions thereof, a concentration analysis is performed focusing on the first group element. The concentration analysis can be performed by using the same method as described above regarding the Al wiring material according to the aspect 1'.

In the present invention, the "total concentration $c_1$ (mass %) of the first group element in the Al core material", the "diameter d (μm) of the Al core material", and the "thickness t (μm) of the Al coating layer" of the Al wiring material according to the aspect 2' can be obtained by using a method described in "—Determination of Al core material and Al coating layer based on total concentration $c_1$ of first group element—" in a column of [Measurement of element content] described later based on the obtained concentration profile. The "total concentration $c_2$ (mass ppm) of the second group element in the Al coating layer" can be measured by using a method described in "—Measurement of total concentration $c_2$ of second group element—" in the column of [Measurement of element content] described later.

—Method for Manufacturing Al Wiring Material—

A method for manufacturing the Al wiring material according to the present invention is not particularly limited so long as the Al wiring material including the hard part and the soft part can be manufactured. There will be described an example of manufacturing an Al bonding wire.

First, in accordance with the composition of the Al core material, an Al raw material (Al raw material having purity of 4N or more) and an additive element raw material are weighed as starting materials, and melted and mixed to obtain an ingot that contains predetermined components with the balance consisting of Al and inevitable impurities. Alternatively, as the raw material for each additive element, a mother alloy containing the additive element in high concentration may be used. This ingot is subjected to wire-drawing using dies to have a finally required diameter of the Al core material. Alternatively, extrusion processing can be performed for a large diameter.

As a method for forming the Al coating layer on the surface of the Al core material, a vapor deposition method, a cladding method, a composite extrusion method, and the like can be used. A stage of compositing/attaching the Al coating layer on the surface of the Al core material is not particularly limited, and may be performed before wire-drawing processing for the Al core material (for example, a stage of extrusion molding the ingot for the core material), may be performed in the middle of the wire-drawing processing for the Al core material, or may be performed after the Al core material is subjected to the wire-drawing to have a final diameter. For example, the Al wiring material according to the present invention may be manufactured by: extrusion-molding the ingot for the core material in a columnar shape; extrusion-molding the ingot for the coating layer in a cylindrical shape; combining them with each other to be subjected to composite-extrusion processing to make a composite wire rod having a columnar shape; and performing wire-drawing processing thereon to have the final diameter.

In order to make each additive element into a solid solution so as to be uniformly distributed, a solution heat treatment may be performed in a state of the ingot, in the middle of processing or after the processing end. The solution heat treatment may be separately performed especially at a stage before compositing/attaching the Al core material and the Al coating layer. In the solution heat treatment, the additive elements are dissolved in Al at a high temperature at which the solid solubility is high. Then, the resultant is cooled to an ordinary temperature at increased cooling rate by water cooling, air cooling, or the like in order to suppress the precipitation of the dissolved elements. The solution heat treatment may be performed, for example, by heating at a temperature range of 500 to 640° C. for 0.5 hours to 3 hours, followed by cooling with water cooling, air cooling, or the like. In a case where the solution heat treatment is performed after the Al core material and the Al coating layer are composited with/attached to each other, the solution heat treatment is performed in a range under a condition for which a difference between the soft part and the hard part does not become unclear due to diffusion in the obtained Al wiring material.

In a case of performing the solution heat treatment, an aging heat treatment may be performed after the solution heat treatment. The aging heat treatment may be separately performed especially at a stage before compositing/attaching the Al core material and the Al coating layer. As a result of the aging heat treatment, a state of solid solution and precipitation of a dopant such as the first group element can be controlled, and the hardness of the Al wiring material can thus be controlled. The aging heat treatment may be performed, for example, at a temperature range of 200 to 400° C. for 0.5 hours to 12 hours. In a case where the aging heat treatment is performed after the Al core material and the Al coating layer are composited with/attached to each other, the aging heat treatment is performed in a range under a condition for which a difference between the soft part and the hard part does not become unclear due to diffusion in the obtained Al wiring material.

In the middle of processing or after the processing end, the Al wiring material may be subjected to a thermal refining heat treatment. By performing the thermal refining heat treatment, the working strain is removed, a recrystallized structure is formed, and a precipitate can be formed. In this thermal refining heat treatment, it is preferable that the heat treatment be continuously performed while the Al wiring material is continuously swept in a heating furnace. Examples of this heat treatment condition may include heating at a temperature range of 200 to 600° C. for a short time of 1 second to 2 minutes. By performing the thermal refining heat treatment, precipitation can proceed. Therefore, the thermal refining heat treatment can simultaneously serve also as the precipitation heat treatment depending on a necessary degree of precipitation.

[Semiconductor Device]

Semiconductor devices can be manufactured by connecting the electrode on the semiconductor chip to the lead frame or an electrode on a circuit board by using the Al wiring material of the present invention.

The semiconductor device of the present invention includes the Al wiring material of the present invention. The Al wiring material according to the present invention achieves both of suppression of a chip damage and thermal shock resistance. The semiconductor device including the Al wiring material may achieve excellent operation reliability even in a case where a significant temperature change is caused in accordance with the operation cycle of the device.

In an embodiment, the semiconductor device of the present invention includes the circuit board, the semiconductor chip, and the Al wiring material for bringing the circuit board and the semiconductor chip into conduction with each other, and is characterized in that the Al wiring material is the Al wiring material of the present invention.

In the semiconductor device of the present invention, the circuit board and the semiconductor chip are not particularly limited, and a known circuit board and semiconductor chip that may be used for constituting the semiconductor device may be used. Alternatively, a lead frame may be used in place of the circuit board. For example, like the semiconductor device disclosed in JP-A-2002-246542, the semiconductor device may include a lead frame and a semiconductor chip mounted on the lead frame.

Examples of the semiconductor device include various semiconductor devices used for electric products (for example, a computer, a cellular telephone, a digital camera, a television, an air conditioner, a solar power generation system), vehicles (for example, a motorcycle, an automobile, an electric train, a ship, and an aircraft), and the like, and a semiconductor device for electric power (power semiconductor device) is especially preferred.

EXAMPLES (Production of Sample)

A method for producing a sample will be described. As the raw material of the Al wiring material, Al having a purity of 99.99 mass % or more with the balance consisting of inevitable impurities was used. As the first group element (Mg, Sc, Y, Ti, Zr, Hf, V, Nb, Cr, Mo, Mn, Fe, Co, Ni, Cu, Ag, Zn, Si) and the second group element (Ni, Pd, Pt), elements having a purity of 99 mass % or more with the balance consisting of inevitable impurities were used. Ingots were casted by compounding and melting these raw materials so that the composition of the Al core material indicated in Table 1 and Table 2 can be obtained. By using the respective ingots, the ingot for the coating layer was extrusion-molded in a cylindrical shape and the ingot for the core material was extrusion-molded in a columnar shape to have predetermined coating layer thickness and core material diameter. Subsequently, by combining them to be subjected to composite-extrusion processing, a columnar composite wire rod having a diameter of 9.5 mm was produced. Regarding some of the samples, after performing the solution heat treatment and the aging heat treatment for the purpose of final hardness adjustment separately at a stage before compositing the wire material, a columnar composite wire rod was produced. The solution heat treatment was performed by heating at a temperature range of 550 to 620° C. for 0.5 hours to 1 hour, followed by cooling with water cooling. The aging heat treatment was performed by heating at a temperature range of 250 to 350° C. for 0.5 hours to 3 hours after the solution heat treatment. The obtained columnar composite wire rod was subjected to the wire-drawing processing with dies to have the final diameter of 300 μm. The thermal refining heat treatment was performed with a diameter of (1) 0.9 to 1.1 mm, (2) 450 to 550 μm, and (3) 300 μm (final diameter) so that predetermined mechanical characteristic and Vickers hardness can be obtained. The thermal refining heat treatment was performed at a processing temperature of 450 to 600° C. for a processing time equal to or longer than 5 seconds and shorter than 1 minute in an Ar atmosphere.

[Measurement of Vickers Hardness]

—Acquisition of Hardness Profile—

The Vickers hardness of the Al wiring material was measured by using a micro Vickers hardness tester ("HM-200" manufactured by Mitutoyo Corporation). Regarding the C cross section of the Al wiring material, as illustrated in FIG. 4, the six straight lines A, B, C, D, E and F the inclinations of which were different from each other by 60° were determined, and the Vickers hardness was measured at each point at a distance of $(6n+1) \times 3$ (μm) (herein, n represents an integral number equal to or larger than 0. The same applies hereinafter) from the surface of the Al wiring material on the straight line A. The Vickers hardness was also measured at each point at a distance of $(6n+2) \times 3$ (μm) on the straight line B, at each point at a distance of $(6n+3) \times 3$ (μm) on the straight line C, at each point at a distance of $(6n+4) \times 3$ (μm) on the straight line D, at each point at a distance of $(6n+5) \times 3$ (μm) on the straight line E, and at each point at a distance of $(6n+6) \times 3$ on the straight line F. Profiles of the Vickers hardness obtained for the respective straight lines A, B, C, D, E and F were then integrated to form one hardness profile. Due to this, the hardness profile indicating the information of the Vickers hardness at intervals of 3 μm from the surface of the Al wiring material toward the center was obtained. For each Al wiring material, the measurement described above was performed for three C cross sections separated from each other by 10 mm or more in the longitudinal direction of the Al wiring material, and the hardness profile was obtained (the number of hardness profiles for each sample was three). The interval for obtaining the information of the Vickers hardness was appropriately changed such that the information of the Vickers hardness was obtained at smaller intervals (2 μm and the like) in a case where the Al coating layer was thin, and thus the flat region (plateau region) on the surface side of the Al wiring material was thin in the obtained hardness profile.

—Determination of Hard Part and Soft Part Based on Vickers Hardness—

(1) Regarding the Al wiring material according to the aspect 1, the Vickers hardness of the soft part (Al core material) was obtained by three-point averaging (simple arithmetic average; hereinafter, the same applies to "average" and "average value") the Vickers hardness of the flat region (plateau region) on the center side of the Al wiring material in the obtained hardness profile. The Vickers hardness of the hard part (Al coating layer) was obtained by three-point averaging the Vickers hardness of the flat region (plateau region) on the surface side of the Al wiring material in the obtained hardness profile. In the hardness profile, a position where the Vickers hardness is equal to [(Vickers hardness of the Al core material)+(Vickers hardness of the Al coating layer)]/2 was determined to be a boundary between the Al core material and the Al coating layer, and a distance from the boundary to the surface was determined to be the thickness (μm) of the Al coating layer. The diameter (μm) of the Al core material was obtained based on an expression: (the diameter of the Al wiring material)−2×(the thickness of the Al coating layer).

Regarding hardness profiles related to three C cross sections, the Vickers hardness of the Al core material, the Vickers hardness of the Al coating layer, the diameter of the Al core material, and the thickness of the Al coating layer were obtained in accordance with the procedure described above. An average value of the Vickers hardness of the Al core material obtained in the three hardness profiles is indicated in a column of "Hardness $H_{1s}$ (Hv)" in Table 2 as the "Vickers hardness $H_{1s}$ (Hv) of the Al core material". Similarly, an average value of the Vickers hardness of the Al coating layer is indicated as the "Vickers hardness $H_{1h}$ (Hv) of the Al coating layer", an average value of the thickness of the Al coating layer is indicated as the "thickness $t_{1hc}$ (μm) of the Al coating layer", and an average value of the diameter of the Al core material is indicated as the "diameter $d_{1sc}$ (μm) of the Al core material" in columns of "hardness $H_{1h}$ (Hv)", "thickness $t_{1hc}$ (μm)", and "diameter $d_{1sc}$ (μm)" in Table 2, respectively.

(2) Regarding the Al wiring material according to the aspect 2, the Vickers hardness of the hard part (Al core material) was obtained by three-point averaging the Vickers hardness of the flat region (plateau region) on the center side of the Al wiring material in the obtained hardness profile. The Vickers hardness of the soft part (Al coating layer) was obtained by three-point averaging the Vickers hardness of the flat region (plateau region) on the surface side of the Al wiring material in the obtained hardness profile. In the hardness profile, a position where the Vickers hardness is equal to [(Vickers hardness of the Al core material)+(Vickers hardness of the Al coating layer)]/2 was determined to be a boundary between the Al core material and the Al coating layer, and a distance from the boundary to the surface was determined to be the thickness (μm) of the Al coating layer. The wire diameter (nm) of the Al core material was obtained based on an expression: (the diameter of the Al wiring material)−2×(the thickness of the Al coating layer).

Regarding hardness profiles related to three C cross sections, the Vickers hardness of the Al core material, the Vickers hardness of the Al coating layer, the diameter of the Al core material, and the thickness of the Al coating layer were obtained in accordance with the procedure described above. Average values of the respective values obtained in the three hardness profiles are indicated as the "Vickers hardness $H_{2h}$ (Hv) of the Al core material", the "Vickers hardness $H_{2s}$ (Hv) of the Al coating layer", the "thickness $t_{2sc}$ (μm) of the Al coating layer", and the "diameter $d_{2hc}$ (μm) of the Al core material" in columns of "hardness $H_{2h}$ (Hv)", "hardness $H_{2s}$ (Hv)", "thickness $t_{2sc}$ (μm)", and "diameter $d_{2hc}$ (μm)" in Table 2, respectively.

[Measurement of Element Content]

—Acquisition of Concentration Profile—

The contents of Al and the first group element in the Al wiring material were measured by using an electro probe microanalyzer (EPMA). For the C cross section of the Al wiring material, by determining a straight line passing from the surface of the Al wiring material through the center like the straight line A illustrated in FIG. 4, and performing linear analysis for the straight line (measurement interval is 0.3 to 1.0 μm), a concentration profile of each element of the first group element and Al was obtained from the surface of the Al wiring material toward the center. Concentration profiles of the respective elements of first group elements were added together to form a profile related to a total concentration of the first group elements (hereinafter, also referred to as a "total concentration profile of the first group elements"). Due to this, the concentration profile indicating the information of the total concentration of the first group elements at predetermined intervals from the surface of the Al wiring material toward the center was obtained. For each Al wiring material, the measurement described above was performed for three C cross sections separated from each other by 10 mm or more in the longitudinal direction of the Al wiring material, and the concentration profile was obtained (the number of concentration profiles for each sample was three).

—Determination of Al Core Material and Al Coating Layer Based on Total Concentration $c_1$ of First Group Elements—

(1) Regarding the Al wiring material according to the aspect 1', a total concentration c (mass %) of the first group elements in the Al coating layer was obtained by three-point averaging the total concentration of the first group elements in a flat region in the vicinity of the surface of the Al wiring material in which a concentration gradient is small in the obtained total concentration profile of the first group elements. In the concentration profile, a position where the total concentration of the first group elements is 0.5c (mass %) was determined to be a boundary between the hard Al coating layer and the soft Al core material, and a distance from the boundary to the surface was determined to be the thickness (μm) of the Al coating layer. The diameter (μm) of the Al core material was obtained based on an expression: (the diameter of the Al wiring material)−2×(the thickness of the Al coating layer).

Regarding total concentration profiles of the first group elements related to three C cross sections, the total concentration c of the first group elements in the Al coating layer, the diameter of the Al core material, and the thickness of the Al coating layer were obtained in accordance with the procedure described above. Average values of the respective values obtained in the three concentration profiles are indicated as the "total concentration $c_1$ (mass %) of the first group elements in the Al coating layer", the "diameter d (μm) of the Al core material", and the "thickness t (μm) of the Al coating layer", respectively.

There is a case where the Al wiring material according to the aspect 1' contains Ni as the first group element in the Al coating layer and contains Ni as the second group element in the Al core material, that is, a case where Ni is contained in both of the Al coating layer and the Al core material (examples of the present invention 1-20, 1-36). Also in this case, it was confirmed that the diameter of the Al core material and the thickness of the Al coating layer could be properly obtained by using the determination method described above (determining that the position of 0.5c is the boundary) focusing on the total concentration c of the first group elements in the Al coating layer. That is, regarding all of the examples 1-1 to 1-36 of the present invention, the diameter d (μm) of the Al core material and the thickness t (μm) of the Al coating layer obtained by using the determination method described above focusing on the total concentration c of the first group elements in the Al coating layer were substantially the same as the diameter $d_{1sc}$ (μm) of the Al core material and the thickness $t_{1hc}$ (μm) of the Al coating layer that were obtained based on the hardness profile.

(2) Regarding the Al wiring material according to the aspect 2', the total concentration c (mass %) of the first group elements in the Al core material was obtained by three-point averaging the total concentration of the first group elements in a flat region in the vicinity of the center of the Al wiring material in which a concentration gradient is small in the obtained total concentration profile of the first group elements. In the concentration profile, a position where the total concentration of the first group elements is 0.5c (mass %) was determined to be a boundary between the Al coating layer and the Al core material, and a distance from the boundary to the surface was determined to be the thickness (μm) of the Al coating layer. The diameter (μm) of the Al core material was obtained based on an expression: (the diameter of the Al wiring material)−2×(the thickness of the Al coating layer).

Regarding total concentration profiles of the first group elements related to three C cross sections, the total concentration c of the first group elements in the Al core material, the diameter of the Al core material, and the thickness of the Al coating layer were obtained in accordance with the procedure described above. Average values of the respective values obtained in the three concentration profiles are indicated as the "total concentration $c_1$ (mass %) of the first group elements in the Al core material", the "diameter d (μm) of the Al core material", and the "thickness t (μm) of the Al coating layer", respectively.

There is a case where the Al wiring material according to the aspect 2' contains Ni as the first group element in the Al core material and contains Ni as the second group element in the Al coating layer, that is, a case where Ni is contained in both of the Al core material and the Al coating layer (example of the present invention 2-5). Also in this case, it was confirmed that the diameter of the Al core material and the thickness of the Al coating layer could be properly obtained by using the determination method described above (determining that the position of 0.5c is the boundary) focusing on the total concentration c of the first group elements in the Al core material. That is, regarding all of the examples 2-1 to 2-36 of the present invention, the diameter d (μm) of the Al core material and the thickness t (μm) of the Al coating layer obtained by using the determination method described above focusing on the total concentration c of the first group elements in the Al core material were substantially the same as the diameter $d_{2hc}$ (μm) of the Al core material and the thickness $t_{2sc}$ (μm) of the Al coating layer that were obtained based on the hardness profile.

—Measurement of Total Concentration $c_2$ of Second Group Element—

The content of the second group element in the Al wiring material was measured as follows using laser ablation ICP mass spectrometry (LA-ICP-MS).

(1) Regarding the Al wiring material according to the aspect 1', the content of the second group element in the Al core material was measured by the LA-ICP-MS for the center of the Al wiring material using the C cross section of the Al wiring material as a measurement surface. The contents of the respective elements of second group elements were added together to obtain the total concentration of the second group elements. For each Al wiring material, the measurement described above was performed for three C cross sections separated from each other by 10 mm or more in the longitudinal direction of the Al wiring material, and the average value of the obtained values was determined to be the "total concentration (mass ppm) of the second group elements in the Al core material".

(2) Regarding the Al wiring material according to the aspect 2', the content of the second group elements in the Al coating layer was measured by the LA-ICP-MS using the surface of the Al wiring material as a measurement surface. The contents of the respective elements of the second group elements were added together to obtain the total concentration of the second group elements. For each Al wiring material, the measurement described above was performed for three surfaces separated from each other by 10 mm or more in the longitudinal direction of the Al wiring material, and the average value of the obtained values was determined to be the "total concentration (mass ppm) of the second group elements in the Al coating layer".

In the semiconductor device, an electrode on the semiconductor chip was an Al—Cu pad, and Ag was used for an external terminal. A first connection part between the electrode on the semiconductor chip and the Al wiring material, and a second connection part between the external terminal and the Al wiring material were both wedge-bonded.

<Evaluation of Chip Damage>

A chip damage in the semiconductor device was evaluated by dissolving metal on a pad surface by acid, and observing a part under the pad by a microscope (the number of evaluations N=50). In the "chip damage" column of Tables 1 and 2, a case in which a crack, traces of bonding, and the like were not found was determined to be favorable to be marked with a symbol of "double circle", a case in which there was no crack but traces of bonding were found at some spots (three spots or less of the number of evaluations 50) was marked with a symbol of "circle", and the other cases were marked with a symbol of "cross".

<Evaluation of Thermal Shock Resistance>

Thermal shock resistance was evaluated by a power cycle test. In the power cycle test, heating and cooling were alternately and repeatedly performed for the semiconductor device to which the Al wiring material was connected. Heating was performed for 2 seconds until the temperature of the connection part of the Al wiring material in the semiconductor device reached 120° C., and cooling was performed for 20 seconds until the temperature of the connection part reached 30° C. This heating/cooling cycle was repeated 100000 times.

After the power cycle test described above, bond shear force of the first connection part was measured, and the connection part reliability was evaluated. The shear force was measured as comparison with shear force of the connection part at an initial stage (before the power cycle test). In the "thermal shock test" column in Tables 1 and 2, a strength equal to or larger than 90% of the connection strength at the initial stage is marked with a symbol of "double circle", a strength equal to or larger than 80% thereof is marked with a symbol of "circle", a strength equal to or larger than 60% thereof is marked with a symbol of "triangle", and a strength smaller than 60% thereof is marked with a symbol of "cross".

The configuration of the Al wiring material and evaluation results are shown in Tables 1 and 2. The examples shown in Table 1 are related to the Al wiring material including the Al core material as the soft part and the Al coating layer as the hard part, and the examples shown in Table 2 are related to the Al wiring material including the Al core material as the hard part and the Al coating layer as the soft part.

TABLE 1

| | | Al core material | | | | | | Al coating layer Content (mass %) | | | | |
|---|---|---|---|---|---|---|---|---|---|---|---|---|
| | | Content (mass ppm) | | | Hardness $H_{1s}$ | Diameter $d_{1sc}$ | | | | | | |
| | No. | Ni | Pd | Pt | (Hv) | (µm) | $d_{1sc}/D$ | Si | Sc | Fe | Ni | Cu |
| Working Example | 1-1 | 3 | | | 17 | 151 | 0.50 | 1.0 | | | | |
| | 1-2 | | | | 17 | 155 | 0.52 | | | | | |
| | 1-3 | 4 | | | 18 | 160 | 0.53 | | | | | |
| | 1-4 | | 1 | | 17 | 223 | 0.74 | | | | | 1.1 |
| | 1-5 | | | 4 | 18 | 227 | 0.76 | | | | | |
| | 1-6 | 1 | | | 17 | 228 | 0.76 | 2.9 | | | | |
| | 1-7 | | | 7 | 19 | 278 | 0.93 | | | | | |
| | 1-8 | | 3 | | 17 | 285 | 0.95 | | 2.1 | | | |
| | 1-9 | 5 | | | 17 | 275 | 0.92 | | | | | |
| | 1-10 | 51 | | | 19 | 150 | 0.50 | | | | | |
| | 1-11 | | 39 | | 18 | 151 | 0.50 | | | 1.8 | | |
| | 1-12 | 67 | | | 19 | 156 | 0.52 | | 3.0 | | | |
| | 1-13 | | 44 | | 18 | 221 | 0.74 | | | | 1.1 | |
| | 1-14 | | | 61 | 17 | 229 | 0.76 | | | | | |
| | 1-15 | | 57 | | 18 | 228 | 0.76 | | | | | 2.7 |
| | 1-16 | 47 | | | 19 | 275 | 0.92 | | | | | |
| | 1-17 | | | 52 | 17 | 279 | 0.93 | | | | | |
| | 1-18 | 50 | | | 20 | 277 | 0.92 | | | | | |
| | 1-19 | | 474 | | 21 | 152 | 0.51 | | | | | |
| | 1-20 | 490 | | | 21 | 155 | 0.52 | | | | 2.2 | |
| | 1-21 | | 469 | | 20 | 156 | 0.52 | | | | | |
| | 1-22 | | | 491 | 19 | 216 | 0.72 | | | | | |
| | 1-23 | 475 | | | 21 | 229 | 0.76 | 2.0 | | | | |
| | 1-24 | 500 | | | 22 | 226 | 0.75 | | | | | |
| | 1-25 | | | 471 | 21 | 267 | 0.89 | | | 1.1 | | |
| | 1-26 | 496 | | | 21 | 268 | 0.89 | | | | | 1.7 |
| | 1-27 | | | 477 | 20 | 271 | 0.90 | | | | | |
| | 1-28 | 3 | | | 17 | 156 | 0.52 | | 0.2 | | | |
| | 1-29 | | | 9 | 18 | 155 | 0.52 | | | | | 0.3 |
| | 1-30 | | | | 16 | 160 | 0.53 | | | | | |
| | 1-31 | | 44 | | 19 | 223 | 0.74 | 0.4 | | | | |
| | 1-32 | | | 70 | 18 | 227 | 0.76 | | | 0.3 | | |
| | 1-33 | 57 | | | 19 | 228 | 0.76 | | | | | |
| | 1-34 | | 471 | | 20 | 278 | 0.93 | | | | | |
| | 1-35 | | | 498 | 21 | 280 | 0.93 | | 0.2 | | | |
| | 1-36 | 480 | | | 22 | 275 | 0.92 | | | | 0.7 | |
| Comparative Example | 1 | | | | 21 | 151 | 0.50 | | | | 0.1 | |
| | 2 | | 50 | | 22 | 155 | 0.52 | | | | | |
| | 3 | 515 | | | 26 | 160 | 0.53 | 2.7 | | | | |
| | 4 | | | 27 | 17 | 148 | 0.49 | | | | | 2.2 |
| | 5 | 123 | | | 19 | 288 | 0.96 | 1.0 | | | | |
| | 6 | | 48 | | 20 | 300 | 1.00 | — | — | — | — | — |

| | | Al coating layer | | | | | | | |
|---|---|---|---|---|---|---|---|---|---|
| | | Content (mass %) | | Hardness $H_{1h}$ | Thickness $t_{1hc}$ | | | Thermal shock | Chip |
| | No. | Zr | Others | (Hv) | (µm) | $t_{1hc}/D$ | $H_{1h}/H_{1s}$ | test | damage |
| Working Example | 1-1 | | | 42 | 74 | 0.25 | 2.5 | ◎ | ○ |
| | 1-2 | 2.1 | | 54 | 72 | 0.24 | 3.2 | ◎ | ○ |
| | 1-3 | | Mg: 3.0% | 50 | 70 | 0.23 | 2.8 | ◎ | ○ |
| | 1-4 | | | 32 | 38 | 0.13 | 1.9 | ◎ | ◎ |
| | 1-5 | | Ti: 2.2% | 35 | 37 | 0.12 | 1.9 | ◎ | ○ |
| | 1-6 | | | 50 | 36 | 0.12 | 2.9 | ◎ | ○ |
| | 1-7 | 1.1 | | 39 | 11 | 0.04 | 2.1 | ◎ | ◎ |
| | 1-8 | | | 59 | 8 | 0.03 | 3.5 | ◎ | ◎ |
| | 1-9 | | V: 2.9% | 42 | 12 | 0.04 | 2.5 | ◎ | ◎ |
| | 1-10 | | Cr: 1.2% | 29 | 75 | 0.25 | 1.5 | ◎ | ○ |
| | 1-11 | | | 35 | 74 | 0.25 | 1.9 | ◎ | ○ |
| | 1-12 | | | 54 | 72 | 0.24 | 2.8 | ◎ | ○ |
| | 1-13 | | | 30 | 39 | 0.13 | 1.7 | ◎ | ◎ |

TABLE 1-continued

| No. | Si | Others | | | | | | |
|---|---|---|---|---|---|---|---|---|
| 1-14 | | Mn: 1.9% | 41 | 35 | 0.12 | 2.4 | ◎ | ○ |
| 1-15 | | | 61 | 36 | 0.12 | 3.4 | ◎ | ○ |
| 1-16 | | Co: 1.0% | 31 | 13 | 0.04 | 1.6 | ◎ | ◎ |
| 1-17 | | Zn: 1.8% | 34 | 10 | 0.03 | 2.0 | ◎ | ◎ |
| 1-18 | 3.0 | | 77 | 11 | 0.04 | 3.9 | ◎ | ○ |
| 1-19 | | Y: 1.0% | 29 | 74 | 0.25 | 1.4 | ◎ | ○ |
| 1-20 | | | 43 | 72 | 0.24 | 2.0 | ◎ | ○ |
| 1-21 | | Nb: 2.9% | 42 | 72 | 0.24 | 2.1 | ◎ | ○ |
| 1-22 | | Mo: 1.1% | 30 | 42 | 0.14 | 1.6 | ◎ | ○ |
| 1-23 | | | 42 | 35 | 0.12 | 2.0 | ◎ | ○ |
| 1-24 | | Ag: 2.7% | 39 | 37 | 0.12 | 1.8 | ◎ | ○ |
| 1-25 | | | 30 | 16 | 0.05 | 1.4 | ◎ | ◎ |
| 1-26 | | | 44 | 16 | 0.05 | 2.1 | ◎ | ○ |
| 1-27 | | Hf: 3.0% | 43 | 15 | 0.05 | 2.2 | ◎ | ○ |
| 1-28 | | | 26 | 72 | 0.24 | 1.5 | ◎ | ◎ |
| 1-29 | | | 25 | 72 | 0.24 | 1.4 | ◎ | ◎ |
| 1-30 | | Mn: 0.2% | 24 | 70 | 0.23 | 1.5 | ◎ | ◎ |
| 1-31 | | | 28 | 38 | 0.13 | 1.5 | ◎ | ◎ |
| 1-32 | | | 27 | 37 | 0.12 | 1.5 | ◎ | ◎ |
| 1-33 | 0.2 | | 30 | 36 | 0.12 | 1.6 | ◎ | ◎ |
| 1-34 | | Mg: 0.5% | 25 | 11 | 0.04 | 1.3 | ◎ | ◎ |
| 1-35 | | | 29 | 10 | 0.03 | 1.4 | ◎ | ◎ |
| 1-36 | | | 31 | 12 | 0.04 | 1.4 | ◎ | ◎ |
| Comparative Example 1 | | | 23 | 74 | 0.25 | 1.1 | X | ◎ |
| 2 | 3.1 | | 80 | 72 | 0.24 | 3.6 | ◎ | X |
| 3 | | | 55 | 70 | 0.23 | 2.1 | ◎ | X |
| 4 | | | 55 | 76 | 0.25 | 3.2 | ◎ | X |
| 5 | | | 32 | 6 | 0.02 | 1.7 | X | ◎ |
| 6 | — — | | — | — | — | — | X | ◎ |

TABLE 2

| | No. | Si | Sc | Fe | Ni | Cu | Zr | Others | Hardness H$_{2h}$ (Hv) | Diameter d$_{2hc}$ (μm) | d$_{2hc}$/D | Al coating layer Content (mass ppm) Ni |
|---|---|---|---|---|---|---|---|---|---|---|---|---|
| Working Example | 2-1 | 1.1 | | | | | | | 32 | 80 | 0.27 | 3 |
| | 2-2 | | 1.0 | | | | | | 43 | 89 | 0.30 | 56 |
| | 2-3 | | | | | | | Cr: 1.1% | 30 | 82 | 0.27 | |
| | 2-4 | | | 1.1 | | | | | 31 | 141 | 0.47 | |
| | 2-5 | | | | 1.2 | | | | 33 | 138 | 0.46 | 60 |
| | 2-6 | | | | | 1.0 | | | 32 | 145 | 0.48 | |
| | 2-7 | | | | | | | Mg: 1.2% | 33 | 197 | 0.66 | |
| | 2-8 | | | | | | | Ti: 1.0% | 28 | 199 | 0.66 | 244 |
| | 2-9 | | | | | | 1.1 | | 40 | 209 | 0.70 | 477 |
| | 2-10 | | | | | | | V: 1.9% | 35 | 85 | 0.28 | |
| | 2-11 | | | | | | | Mn: 2.0% | 41 | 83 | 0.28 | 47 |
| | 2-12 | | 1.9 | | | | | | 64 | 80 | 0.27 | 498 |
| | 2-13 | | | | | | 2.2 | | 60 | 144 | 0.48 | |
| | 2-14 | | | | | | | Co: 1.9% | 35 | 135 | 0.45 | |
| | 2-15 | | | | | 1.8 | | | 40 | 142 | 0.47 | |
| | 2-16 | 2.2 | | | | | | | 41 | 194 | 0.65 | |
| | 2-17 | | | | | | | Zn: 2.0% | 42 | 193 | 0.64 | 55 |
| | 2-18 | | | | | | | Y: 2.1% | 37 | 200 | 0.67 | 487 |
| | 2-19 | | | | | | | Nb: 2.9% | 44 | 81 | 0.27 | 5 |
| | 2-20 | | 2.8 | | | | | | 77 | 85 | 0.28 | |
| | 2-21 | | | | | | | Mo: 3.0% | 41 | 84 | 0.28 | 480 |
| | 2-22 | | | | 3.0 | | | | 55 | 140 | 0.47 | |
| | 2-23 | | | | | | | Ag: 2.7% | 43 | 141 | 0.47 | 61 |
| | 2-24 | | | 2.9 | | | | | 50 | 144 | 0.48 | |
| | 2-25 | | | | | | 3.0 | | 78 | 197 | 0.66 | |
| | 2-26 | | | | | | | Hf: 2.9% | 44 | 198 | 0.66 | 49 |
| | 2-27 | 2.9 | | | | | | | 53 | 193 | 0.64 | |
| | 2-28 | | | | | | | Ti: 0.2% | 27 | 85 | 0.28 | 7 |
| | 2-29 | | | 0.4 | | | | | 28 | 83 | 0.28 | |
| | 2-30 | | | | | | | Cr: 0.5% | 27 | 76 | 0.25 | |
| | 2-31 | 0.6 | | | | | | | 23 | 144 | 0.48 | |
| | 2-32 | | 0.2 | | | | | | 30 | 135 | 0.45 | |
| | 2-33 | | | | | 0.3 | | | 26 | 142 | 0.47 | 500 |
| | 2-34 | | | | | | 0.2 | | 29 | 192 | 0.64 | |
| | 2-35 | | | | | | | Mo: 0.4% | 26 | 193 | 0.64 | |
| | 2-36 | | | | | | | Ag: 0.6% | 26 | 200 | 0.67 | |
| Comparative | 1 | | | | | | 0.1 | | 25 | 85 | 0.28 | |
| ative | 2 | | | | 3.2 | | | | 79 | 199 | 0.66 | 47 |

TABLE 2-continued

| Example | | | | | | | |
|---|---|---|---|---|---|---|---|
| 3 | 3.0 | | | 80 | 194 | 0.65 | |
| 4 | | 2.4 | | 42 | 73 | 0.24 | |
| 5 | | | Cr: 2.9% | 66 | 212 | 0.71 | 446 |
| 6 | 2.8 | | | 53 | 300 | 1.00 | — |

| | | Al coating layer | | | | | | | |
|---|---|---|---|---|---|---|---|---|---|
| | | Content (mass ppm) | | Hardness $H_{2s}$ | Diameter $t_{2sc}$ | | | Thermal shock | Chip |
| | No. | Pd | Pt | (Hv) | (μm) | $t_{2sc}/D$ | $H_{2h}/H_{2s}$ | test | damage |
| Working Example | 2-1 | | | 17 | 110 | 0.37 | 1.9 | ○ | ◎ |
| | 2-2 | | | 19 | 106 | 0.35 | 2.3 | ○ | ◎ |
| | 2-3 | 487 | | 21 | 109 | 0.36 | 1.4 | ○ | ◎ |
| | 2-4 | | 5 | 18 | 80 | 0.27 | 1.7 | ◎ | ◎ |
| | 2-5 | | | 18 | 81 | 0.27 | 1.8 | ◎ | ◎ |
| | 2-6 | | 500 | 22 | 78 | 0.26 | 1.5 | ◎ | ○ |
| | 2-7 | | | 17 | 52 | 0.17 | 1.9 | ◎ | ◎ |
| | 2-8 | | | 20 | 51 | 0.17 | 1.4 | ◎ | ◎ |
| | 2-9 | | | 20 | 46 | 0.15 | 2.0 | ◎ | ○ |
| | 2-10 | 1 | | 18 | 108 | 0.36 | 1.9 | ○ | ◎ |
| | 2-11 | | | 18 | 109 | 0.36 | 2.3 | ○ | ◎ |
| | 2-12 | | | 21 | 110 | 0.37 | 3.0 | ○ | ◎ |
| | 2-13 | | 4 | 17 | 78 | 0.26 | 3.5 | ◎ | ○ |
| | 2-14 | 67 | | 18 | 82 | 0.27 | 1.9 | ◎ | ◎ |
| | 2-15 | 478 | | 22 | 79 | 0.26 | 1.8 | ◎ | ○ |
| | 2-16 | | | 17 | 53 | 0.18 | 2.4 | ◎ | ○ |
| | 2-17 | | | 19 | 53 | 0.18 | 2.2 | ◎ | ○ |
| | 2-18 | | | 21 | 50 | 0.17 | 1.8 | ◎ | ○ |
| | 2-19 | | | 17 | 109 | 0.36 | 2.6 | ○ | ◎ |
| | 2-20 | | 67 | 20 | 107 | 0.36 | 3.9 | ○ | ◎ |
| | 2-21 | | | 21 | 108 | 0.36 | 2.0 | ○ | ◎ |
| | 2-22 | 2 | | 19 | 80 | 0.27 | 2.9 | ◎ | ○ |
| | 2-23 | | | 18 | 80 | 0.27 | 2.4 | ◎ | ◎ |
| | 2-24 | | 485 | 22 | 78 | 0.26 | 2.3 | ◎ | ○ |
| | 2-25 | 3 | | 17 | 52 | 0.17 | 4.6 | ◎ | ○ |
| | 2-26 | | | 19 | 51 | 0.17 | 2.3 | ◎ | ○ |
| | 2-27 | 472 | | 21 | 53 | 0.18 | 2.5 | ◎ | ○ |
| | 2-28 | | | 19 | 108 | 0.36 | 1.4 | ○ | ◎ |
| | 2-29 | | 54 | 19 | 109 | 0.36 | 1.5 | ○ | ◎ |
| | 2-30 | 471 | | 21 | 112 | 0.37 | 1.3 | ○ | ◎ |
| | 2-31 | | | 16 | 78 | 0.26 | 1.4 | ○ | ◎ |
| | 2-32 | 60 | | 19 | 82 | 0.27 | 1.6 | ○ | ◎ |
| | 2-33 | | | 21 | 79 | 0.26 | 1.2 | ○ | ◎ |
| | 2-34 | | 4 | 18 | 54 | 0.18 | 1.6 | ○ | ◎ |
| | 2-35 | 71 | | 19 | 53 | 0.18 | 1.4 | ○ | ◎ |
| | 2-36 | | 466 | 21 | 50 | 0.17 | 1.2 | ○ | ◎ |
| Comparative Example | 1 | | 202 | 22 | 108 | 0.36 | 1.1 | X | ◎ |
| | 2 | | | 20 | 51 | 0.17 | 4.0 | ◎ | X |
| | 3 | 503 | | 25 | 53 | 0.18 | 3.2 | ◎ | X |
| | 4 | | 27 | 17 | 113 | 0.38 | 2.5 | X | ◎ |
| | 5 | | | 24 | 44 | 0.15 | 2.8 | ◎ | X |
| | 6 | — | — | — | — | — | — | ◎ | X |

The invention claimed is:

1. An Al wiring material comprising an Al core material and an Al coating layer formed on a surface of the Al core material, wherein the Al wiring material satisfies $1.2 \leq H_{1h}/H_{1s}$ and $x2 < x1$, where $H_{1s}$ is a Vickers hardness of the Al core material (Hv), $H_{1h}$ is a Vickers hardness of the Al coating layer (Hv), x1 is an Al content in the Al core material (mass %), and x2 is an Al content in the Al coating layer (mass %).

2. The Al wiring material according to claim 1, satisfying $$0.5D \leq d_{1sc} \leq 0.95D$$

where D is a diameter of the Al wiring material (μm) and $d_{1sc}$ is a diameter of the Al core material (μm).

3. The Al wiring material according to claim 1, satisfying a relation of $95 \leq x2 < x1$ where x1 is an Al content in the Al core material (mass %) and x2 is an Al content in the Al coating layer (mass %).

4. An Al wiring material comprising an Al core material and an Al coating layer formed on a surface of the Al core material, wherein the Al wiring material satisfies $1.2 \leq H_{2h}/H_{2s}$ and $0.25D \leq d_{2hc} \leq 0.7D$, where $H_{2h}$ is a Vickers hardness of the Al core material (Hv), $H_{2s}$ is a Vickers hardness of the Al coating layer (Hv), D is a diameter of the Al wiring material (μm), and $d_{2hc}$ is a diameter of the Al core material.

5. The Al wiring material according to claim 4, satisfying $$0.3D \leq d_{2hc} \leq 0.65D$$

where D is a diameter of the Al wiring material (μm) and $d_{2hc}$ is a diameter of the Al core material.

6. The Al wiring material according to claim 4, satisfying a relation of $95 \leq y1 < y2$ where y1 is an Al content in the Al core material (mass %) and y2 is an Al content in the Al coating layer (mass %).

7. An Al wiring material comprising an Al core material and an Al coating layer formed on a surface of the Al core material, wherein the Al coating layer contains 0.2 to 3 mass %, in total, of one or more element selected from the group consisting of Mg, Sc, Y, Ti, Zr, Hf, V, Nb, Cr, Mo, Mn, Fe, Co, Ni, Cu, Ag, Zn and Si (hereinafter, referred to as a "first group element"), and the Al core material contains 0 to 500 mass ppm, in total, of a metallic element of the group 10 of the periodic table of elements.

8. The Al wiring material according to claim 7, satisfying $$0.5D \leq d \leq 0.95D$$

where D is a diameter of the Al wiring material ($\mu$m) and d is a diameter of the Al core material ($\mu$m).

9. An Al wiring material comprising an Al core material and an Al coating layer formed on a surface of the Al core material, wherein the Al core material contains 0.2 to 3 mass %, in total, of one or more element selected from the group consisting of Mg, Sc, Y, Ti, Zr, Hf, V, Nb, Cr, Mo, Mn, Fe, Co, Ni, Cu, Ag, Zn and Si (hereinafter, referred to as a "first group element"), the Al coating layer contains 0 to 500 mass ppm, in total, of a metallic element of the group 10 of the periodic table of elements, and the Al wiring material satisfies $0.25D \leq d \leq 0.7D$, where D is a diameter of the Al wiring material ($\mu$m) and d is a diameter of the Al core material ($\mu$m).

10. The Al wiring material according to claim 9, satisfying $$0.3D \leq d \leq 0.65D$$

where D is a diameter of the Al wiring material ($\mu$m) and d is a diameter of the Al core material ($\mu$m).

11. The Al wiring material according to claim 7, wherein the first group element is selected from the group consisting of Sc, Zr, Fe, Ni, Cu and Si.

12. The Al wiring material according to claim 1, wherein a diameter of the Al wiring material is 100 to 600 $\mu$m.

13. The Al wiring material according to claim 1, wherein the Al wiring material is a bonding wire.

14. A semiconductor device comprising the Al wiring material according to claim 1.

15. The Al wiring material according to claim 9, wherein the first group element is selected from the group consisting of Sc, Zr, Fe, Ni, Cu and Si.

16. The Al wiring material according to claim 4, wherein a diameter of the Al wiring material is 100 to 600 $\mu$m.

17. The Al wiring material according to claim 4, wherein the Al wiring material is a bonding wire.

18. The Al wiring material according to claim 1, satisfying $$0.52D \leq d_{1sc} \leq 0.95D$$

where D is a diameter of the Al wiring material ($\mu$m) and $d_{1sc}$ is a diameter of the Al core material ($\mu$m).

19. The Al wiring material according to claim 9, wherein the first group element is at least one selected from the group consisting of Mg, Sc, Y, Ti, Zr, Hf, V, Nb, Cr, Mo, Mn, Fe, Co, Ni, Cu, Ag, and Zn.

20. The Al wiring material according to claim 9, wherein a total concentration of first group element is 1.1 to 3 mass %.

* * * * *